(12) United States Patent
Yamazaki et al.

(10) Patent No.: US 10,451,965 B2
(45) Date of Patent: Oct. 22, 2019

(54) IMPRINT SYSTEM AND METHOD OF MANUFACTURING ARTICLE

(71) Applicant: CANON KABUSHIKI KAISHA, Tokyo (JP)

(72) Inventors: Takuro Yamazaki, Utsunomiya (JP); Tomomi Funayoshi, Utsunomiya (JP); Masayoshi Fujimoto, Utsunomiya (JP); Hiromitsu Yamaguchi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 477 days.

(21) Appl. No.: 15/063,824

(22) Filed: Mar. 8, 2016

(65) Prior Publication Data
US 2016/0271845 A1    Sep. 22, 2016

(30) Foreign Application Priority Data

Mar. 18, 2015 (JP) ................................ 2015-055353

(51) Int. Cl.
*G03F 7/00* (2006.01)
(52) U.S. Cl.
CPC ................................ *G03F 7/0002* (2013.01)
(58) Field of Classification Search
None
See application file for complete search history.

(56) References Cited

U.S. PATENT DOCUMENTS

| 8,560,977 | B2 | 10/2013 | Matsuoka et al. |
| 8,740,377 | B2 | 6/2014 | Mikami et al. |
| 2010/0233377 | A1 | 9/2010 | Aoki et al. |
| 2014/0246799 | A1 | 9/2014 | Sato |
| 2015/0008605 | A1 | 1/2015 | Sato |

FOREIGN PATENT DOCUMENTS

| JP | 2010239118 A | 10/2010 |
| JP | 2012114157 A | 6/2012 |
| JP | 2012234901 A | 11/2012 |
| JP | 5214683 B2 | 6/2013 |
| JP | 2015023149 A | 2/2015 |
| JP | 2015023151 A | 2/2015 |
| JP | 2015029070 A | 2/2015 |

OTHER PUBLICATIONS

Notice of Preliminary Rejection issued in Korean Appln. No. 10-2016-0028626 dated Mar. 14, 2019.
Office Action issued in Chinese Appln. No. 201610154452.4 dated Apr. 9, 2019. English translation provided.

*Primary Examiner* — Timothy Kennedy
(74) *Attorney, Agent, or Firm* — Rossi, Kimms & McDowell LLP

(57) ABSTRACT

The present invention provides an imprint system which performs an imprint process of forming a pattern of an imprint material on the substrate by using a mold, the system comprising a plurality of processing units each including a dispenser which supplies the imprint material onto the substrate and configured to perform the imprint process, a library configured to manage a plurality of pieces of layout information, and a control unit configured to, when the mold used by a first processing unit is used by a second processing unit, control the second processing unit, based on a difference in condition for the imprint process between the first and second processing units, by using layout information having a difference corresponding to the difference in condition for the imprint process with respect to layout information used by the first processing unit.

15 Claims, 11 Drawing Sheets

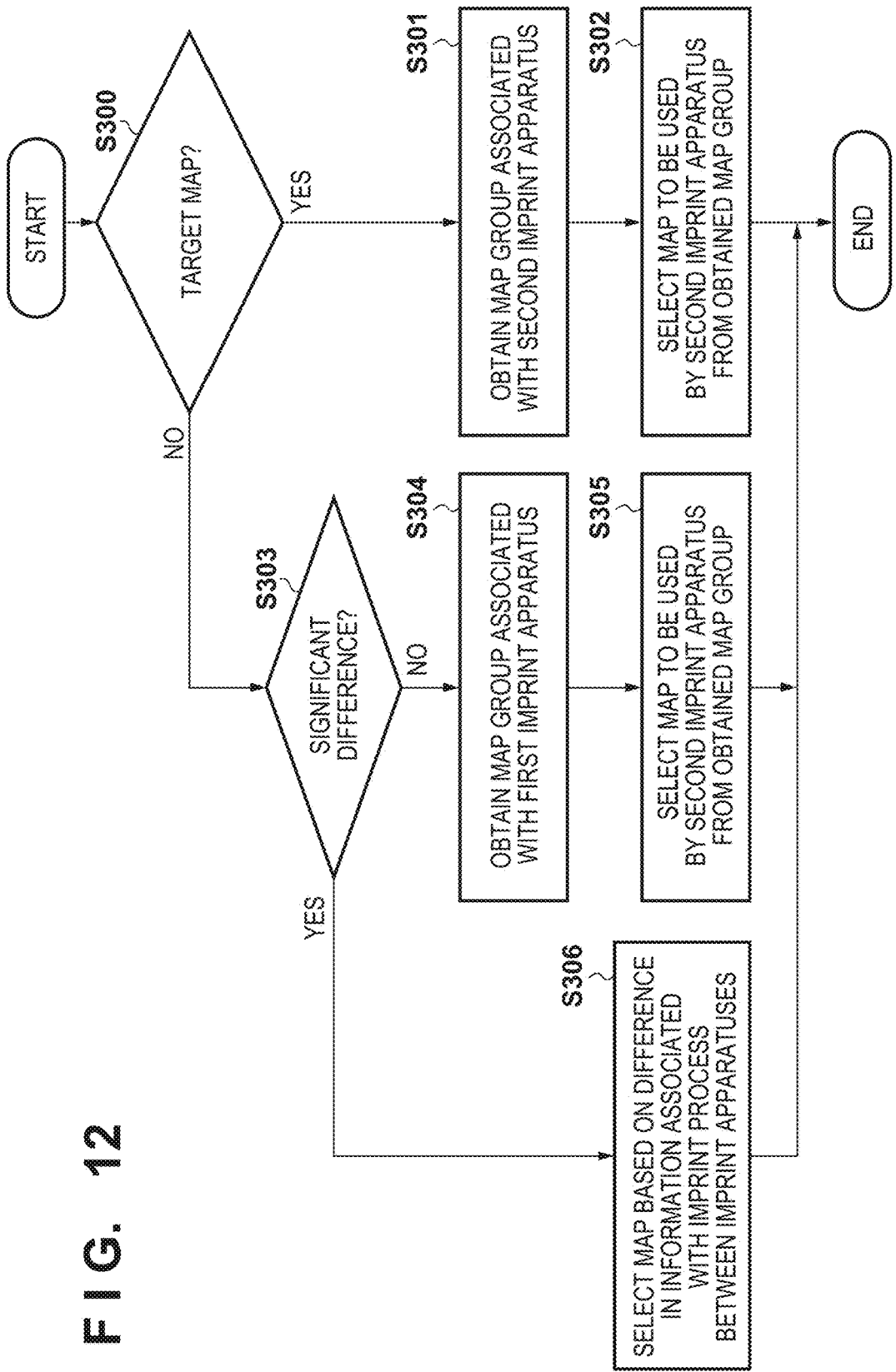

IMPRINT SYSTEM AND METHOD OF MANUFACTURING ARTICLE

BACKGROUND OF THE INVENTION

Field of the Invention

The present invention relates to an imprint system and a method of manufacturing an article.

Description of the Related Art

An imprint technique is a technique of enabling the formation of a nano-scale fine pattern and has attracted attention as one of mass production nanolithography techniques for semiconductor devices and magnetic storage media. An imprint apparatus using an imprint technique supplies an imprint material onto a substrate in accordance with, for example, a map (also called a dispensing pattern, an imprint recipe, or a drop recipe) on a substrate on which imprint material droplets are dispensed. A pattern of the imprint material can then be formed on the substrate by curing the imprint material supplied onto the substrate while the imprint material is in contact with a mold.

An imprint apparatus may generate a map so as to reduce defects, RLT (Residual Layer Thickness) abnormality, and the like in a pattern of an imprint material formed on a substrate. Japanese Patent No. 5214683 has proposed a method of generating a map in consideration of the amount of imprint material with which a mold pattern is filled, the residual layer thickness of the pattern to be formed on a substrate, the positions of shot regions and edges of the substrate, the concave-convex distribution of the underlayer (substrate), and variations in machining dimension in a post process. Japanese Patent Laid-Open No. 2012-114157 has proposed a method of generating a map for one shot region by combining maps generated for the respective circuit blocks constituting a semiconductor integrated circuit.

In an imprint system including a plurality of imprint apparatuses (processing units), a mold used by a predetermined imprint apparatus is sometimes used by another imprint apparatus. In this case, an imprint process may be performed so as not to cause any difference between patterns of imprint material shapes formed on the substrate by using molds. If, however, a map used by a predetermined imprint apparatus is applied to another imprint apparatus, defects, RLT (Residual Layer Thickness), and the like of a pattern formed from an imprint material can change because of individual differences between these imprint apparatuses. On the other hand, if a new map is generated when using the mold in another imprint apparatus, since an imprint process in the imprint apparatus is interrupted during the generation of the map, the productivity (operating rate) of the imprint apparatus can decrease.

SUMMARY OF THE INVENTION

The present invention provides an imprint system advantageous in, for example, productivity.

According to one aspect of the present invention, there is provided an imprint system which performs an imprint process of forming a pattern of an imprint material supplied on the substrate by using a mold, the system comprising: a plurality of processing units each including a dispenser which supplies the imprint material onto the substrate and configured to perform the imprint process; a library configured to manage a plurality of pieces of layout information which are different from each other, each of the plurality of pieces of layout information indicating a layout of the imprint material on the substrate which is to be supplied from the dispenser; and a control unit configured to, when the mold used by a first processing unit of the plurality of processing units is used by a second processing unit different from the first processing unit, control the second processing unit, based on a difference in condition for the imprint process between the first processing unit and the second processing unit, by using layout information having a difference corresponding to the difference in condition for the imprint process with respect to layout information used by the first processing unit.

Further features of the present invention will become apparent from the following description of exemplary embodiments with reference to the attached drawings.

BRIEF DESCRIPTION OF THE DRAWINGS

FIG. 12 is a flowchart for explaining the selection of a map.

DESCRIPTION OF THE EMBODIMENTS

Figure 1:
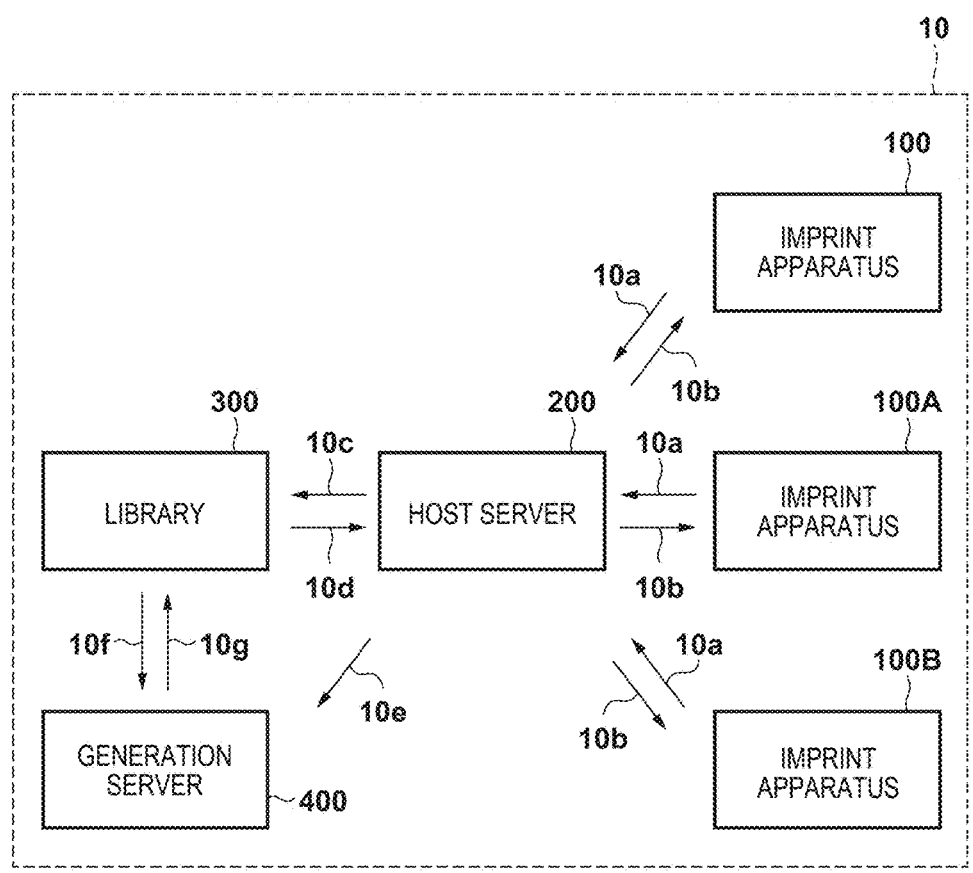
FIG. 1 is a schematic view showing the arrangement of an imprint system.

Exemplary embodiments of the present invention will be described below with reference to the accompanying drawings. Note that the same reference numerals denote the same members throughout the drawings, and a repetitive description thereof will not be given.

First Embodiment

An imprint system 10 according to the first embodiment of the present invention will be described. FIG. 1 is a schematic view showing the arrangement of the imprint system 10 according to one aspect of the present invention. The imprint system 10 supplies an imprint material (for example, a resin) onto a substrate and performs an imprint process of forming a pattern on the imprint material supplied onto the substrate by using a mold. This embodiment uses, as a method of curing an imprint material, a photo-curing method of curing an imprint material by irradiation with ultraviolet light. However, the embodiment is not limited to this, and may use a thermal curing method of curing an imprint material with heat. The imprint system 10 can include a plurality of imprint apparatuses 100 (processing units), a host server 200 (control unit), a library 300, and a generation server 400 (generation unit).

Each of the plurality of imprint apparatuses 100 includes a dispenser (dispensing unit) for supplying an imprint material onto a substrate, and functions as a processing unit which performs an imprint process. For example, each imprint apparatus 100 supplies imprint material droplets onto a substrate in accordance with a map indicating the layout of imprint material droplets on the substrate, which are to be supplied from the dispenser. The imprint apparatus 100 then forms a pattern on an imprint material on a substrate by curing the imprint material on the substrate, while the imprint material is in contact with a mold, and releasing the mold from the cured imprint material. A map is also called layout information, a dispensing pattern, an imprint recipe, a drop recipe, or the like. Each of the plurality of imprint apparatuses 100 has a function 10a of transmitting information concerning imprint process conditions and the state of the imprint apparatus 100 to the host server 200.

The host server 200 is formed from a computer including a CPU, a memory, and an HDD, and controls the respective units of the imprint system 10, that is, the plurality of imprint apparatuses 100, the library 300, and the generation server 400. The host server 200 controls, for example, a map indicating the layout of imprint material droplets on a substrate, which are to be supplied from the dispenser. In addition, the host server 200 controls imprint conditions (imprint material conditions) when performing an imprint process. The host server 200 has a function 10b of transmitting a map used for an imprint process, that is, a map suitable for the imprint process, to the imprint apparatus 100 and a function 10c of referring to maps managed by the library 300. The host server 200 also has a function 10e of transmitting a job to instruct the generation of a new map and information necessary for the generation of the map to the generation server 400. In this case, the information necessary for the generation of the map can include, for example, the dimensions of a mold pattern, the residual layer thickness of a pattern to be formed on a substrate (a pattern formed on an imprint material), information of distribution in a substrate surface, and layout information of shot regions on the substrate. In addition, the information of distribution in the substrate surface can include the distribution of evaporation volumes of an imprint material in the substrate surface and the distribution of gas flows in the substrate surface.

The library 300 is formed from a computer including a CPU, a memory, and an HDD, and manages (stores) maps (layout information) indicating the layouts of imprint material droplets on substrates, which are to be supplied from the dispensers. The library 300 has a function 10d of transmitting a map suitable for an imprint material to the host server 200 and a function 10f of transmitting information necessary for the generation of a map to the generation server 400. The library 300 may also have a function of analyzing the generation history and selection history of a plurality of stored maps.

The generation server 400 is formed from a computer including a CPU, a memory, and an HDD, and generates a map indicating the layout (supply positions) of imprint material droplets on a substrate, which are to be supplied from the dispenser, in accordance with a job from the host server 200. In this case, the generation server 400 generates a map based on the dimensions of a mold pattern (the designed values or actual measured values of a mold) and the residual layer thickness of a pattern to be formed on a substrate. In addition, the generation server 400 may generate a map based on at least one of information of distribution in a substrate surface, including the distribution of evaporation volumes of an imprint material in the substrate surface and the distribution of gas flows in the substrate surface, and layout information of shot regions on the substrate. The generation server 400 obtains information necessary for the generation of such a map from the host server 200 or the library 300, as described above. The generation server 400 also has a function 10g of transmitting a generated map to the library 300.

In this case, the functions between the apparatuses, the servers, and the library constituting the imprint system 10 are not limited to the arrangement shown in FIG. 1, and may be implemented between apparatuses, servers, and a library having an arrangement different from that shown in FIG. 1. In addition, the host server 200, the library 300, and the generation server 400 may be provided outside the imprint system 10. In this case, however, the host server 200, the library 300 and the generation server 400 are connected to each of the plurality of imprint apparatuses 100 so as to provide a map suitable for an imprint process to each of the imprint apparatuses 100.

In the imprint system 10 having such an arrangement, the library 300 stores, in advance, a plurality of different maps generated in accordance with patterns to be formed on substrates and residual layer thicknesses. For example, it is possible to select a map to be used by each imprint apparatus 100 from a plurality of maps managed by the library 300 in accordance with the pattern shape of a mold used by the imprint apparatus 100. In this case, in the imprint system 10, it is sometimes difficult to equalize imprint process results obtained by the plurality of imprint apparatuses 100 because of individual differences between the plurality of imprint apparatuses, manufacturing errors in the pattern shapes of a plurality of molds, and the like. For this reason, in the imprint system 10 according to this embodiment, pieces of identification information (apparatus IDs and mold IDs) are respectively set for the respective imprint apparatuses 100 and the respective molds. The library 300 manages a plurality of maps in association with the identification information of a corresponding one of the imprint apparatuses 100 and the identification information of a corresponding one of molds 101. The host server 200 selects a map to be used by each imprint apparatus 100 from a plurality of maps managed by the library 300 based on pieces of identification information respectively set for the imprint apparatus 100 and a mold used by it. This allows the imprint system 10 to properly select a map corresponding to a combination of the imprint apparatus 100 and the mold. This can reduce variations in shape and residual layer thickness between patterns on imprint materials formed by molds.

In this case, the host server 200 manages information concerning imprint process conditions in each imprint apparatus 100 in association with the identification information of the imprint apparatus 100. Imprint process conditions can include, for example, at least one of the evaporation volume of droplets per unit time in the imprint process, the amount of imprint material supplied onto a substrate, and the amount and position accuracy of imprint material droplets supplied onto the substrate by the dispenser. The information may also include the age of the imprint material (the period from the start of the use of the imprint material). In addition, the host server 200 manages information concerning the pattern shape of each mold in association with the identification information of the mold 101. Information concerning the pattern shape of each mold can include, for example, at least one of the design information and actual dimensions of a pattern formed on the mold, defect information (the number of defects), the number of times of cleaning, and the number of times of imprinting.

In the imprint system 10 according to this embodiment, a plurality of maps managed by the library 300 sometimes include no map corresponding to both any of the imprint apparatuses 100 and a mold. In this case, based on information concerning imprint material conditions in each imprint apparatus 100 and information concerning the pattern shape of each mold, a map which can make its influence on an imprint process result fall within an allowable range may be selected. Assume that imprint process conditions in a first imprint apparatus 100A and a second imprint apparatus 100B of the plurality of imprint apparatuses 100 are almost the same. In this case, a map to be used by the second imprint apparatus 100B may be selected from a plurality of maps managed in association with the first imprint apparatus 100A.

In addition, as described above, the imprint system 10 manages information concerning imprint material conditions and information concerning the pattern shapes of molds in association with the pieces of identification information of the imprint apparatuses 100 and the pieces of identification information of the molds 101. For this reason, the library 300 manages a plurality of maps corresponding to changes (for example, changes over time) in the imprint apparatuses 100 and the molds (which will be described below) so as to allow the selection of a suitable map in accordance with the changes. This can reduce the influences of changes in the imprint apparatuses 100 and the molds on imprint process results. That is, this can make the dimensions of imprint material patterns formed by molds fall within an allowable range.

Changes in the imprint apparatuses 100 can include changes in the evaporation volume of droplets per unit time in an imprint process and changes in the amount of droplets supplied from the dispensers to a substrate and position accuracy. Changes in the imprint apparatuses 100 can be obtained by performing test imprint processes and the like. In addition, changes in molds can include changes in pattern dimensions caused by imprint processes and mold cleaning and changes in the number of defects and position. The dimensions of a pattern can include the depth of each concave portion of the mold pattern, the line width (CD: Critical Dimension) of the pattern, and a taper angle. Changes in molds can be obtained from results of measuring the pattern shapes of molds after imprint processes.

A plurality of maps corresponding to changes in the imprint apparatuses 100 and molds will be described below. For example, the library can manage, in association with the imprint apparatuses 100, a plurality of maps which differ in the number of droplets by 1% so as to correspond to changes in the evaporation volume of droplets by 1% in imprint processes. In addition, the library can manage, in association with the imprint apparatuses 100, a plurality of maps which differ in the amount of droplets by 1% so as to correspond to changes in the amount of droplets discharged from the dispensers by 1%. This makes it possible to select a map corresponding to changes in each imprint apparatus 100.

Likewise, for example, the library manages, in association with molds, a plurality of maps which differ in the number of droplets by the number of droplets corresponding to a concave portion depth of 1 nm so as to correspond to changes in the concave portion depths of mold patterns by 1 nm. In addition, the library manages, in association with molds, a plurality of maps which differ in the number of droplets by the number of droplets corresponding to a line width of 1 nm so as to correspond to changes in the line widths of mold patterns by 1 nm. This makes it possible to select a map corresponding to a changes in each mold.

[Arrangement of Imprint Apparatus]

Figure 2:
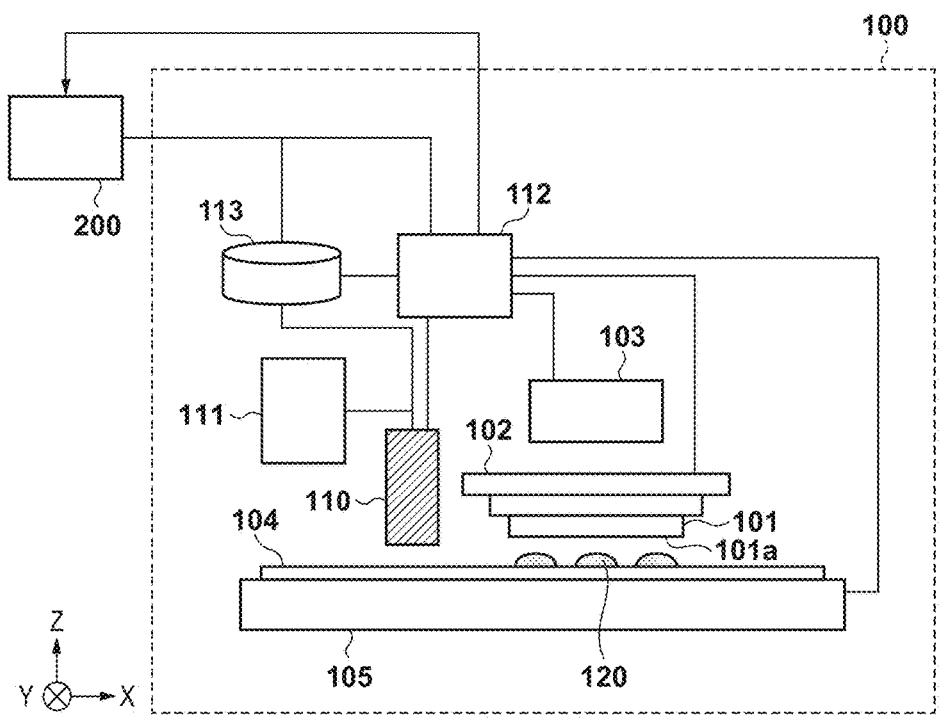
FIG. 2 is a schematic view showing the arrangement of an imprint apparatus.

FIG. 2 is a schematic view showing the arrangement of each imprint apparatus 100 in the imprint system 10. The imprint apparatus 100 is a lithography apparatus used in a manufacturing process for semiconductor devices and the like, and molds the imprint material on the substrate by using a mold. The imprint apparatus 100 includes a head 102 which holds the mold 101, an irradiation unit 103, a stage 105 which holds a substrate 104, a dispenser 110, a supply unit 111, a control unit 112, and a storage unit 113.

The mold 101 has, on its surface facing the substrate 104, a pattern region 101a on which pattern to be transferred to an imprint material 120 supplied to the substrate 104 is formed. The mold 101 has, for example, a rectangular outer shape. The mold 101 can be formed from a material which transmits ultraviolet light for curing the imprint material 120 on the substrate, such as quarts. In addition, the substrate 104 is a substrate onto which a pattern of the mold 101 is transferred, and includes, for example, a single-crystal silicon substrate or SOI (Silicon on Insulator) substrate.

The head 102 holds (fixes) the mold 101 with a vacuum suction force or electrostatic force. The head 102 includes a driving mechanism for driving (moving) the mold 101 in the Z-axis direction. The head 102 has a function of imprinting the mold 101 on the uncured imprint material 120 supplied onto the substrate and a function of releasing the mold 101 from the cured imprint material 120 on the substrate.

The stage 105 includes a substrate chuck which holds the substrate 104 and a driving mechanism for aligning the mold 101 with the substrate 104. This driving mechanism is constituted by, for example, a coarse motion driving system and a fine motion driving system, and drives (moves) the substrate 104 in the X-axis and Y-axis directions. In addition, the driving mechanism may have a function of driving the substrate 104 in the Z-axis direction and the 0 direction (the rotational direction around the Z-axis) as well as in the X-axis and Y-axis directions and a tilt function of correcting the tilt of the substrate 104.

The irradiation unit 103 has a function of curing the imprint material 120 on a substrate. The irradiation unit 103 includes, for example, a halogen lamp or LED, and irradiates a resin on a substrate with ultraviolet light through the mold 101.

The supply unit 111 includes a tank which stores the uncured imprint material 120. The supply unit 111 supplies the uncured imprint material 120 to the dispenser 110 through a supply pipe. The dispenser 110 includes a plurality of nozzles (discharge outlets) which discharge droplets of the imprint material 120 to the substrate 104, and supplies (dispenses) the imprint material 120 onto the substrate. In this embodiment, the unit of the supply amount of the imprint material 120 from the dispenser 110 is "droplet", and the amount of imprint material 120 per droplet ranges from sub-picoliter to several picoliters. One droplet of the imprint material 120 is supplied onto a substrate by one discharging operation of each nozzle (each discharge outlet). Positions on a substrate on which droplets of the imprint material 120 are dropped from the dispenser 110 are set every several μm. The layout of droplets of the imprint material 120 is formed on a substrate by driving the stage 105 while supplying the imprint material 120 from the supply unit 111 to the dispenser 110, and discharging droplets of the imprint material 120 from the dispenser 110.

The control unit 112 includes a CPU and a memory, and controls the overall operation of the imprint apparatus 100. The control unit 112 controls each unit of the imprint apparatus 100 to perform an imprint process. In addition, the control unit 112 transmits an imprint process result, the use histories of the mold 101 and the dispenser 110, information concerning the evaporation of the imprint material 120, such as changes in temperature and humidity in an imprint environment, and the like to the host server 200, as needed. The control unit 112 stores a map obtained from the host server 200 in the storage unit 113.

[Arrangement of Host Sever]

Figure 3:
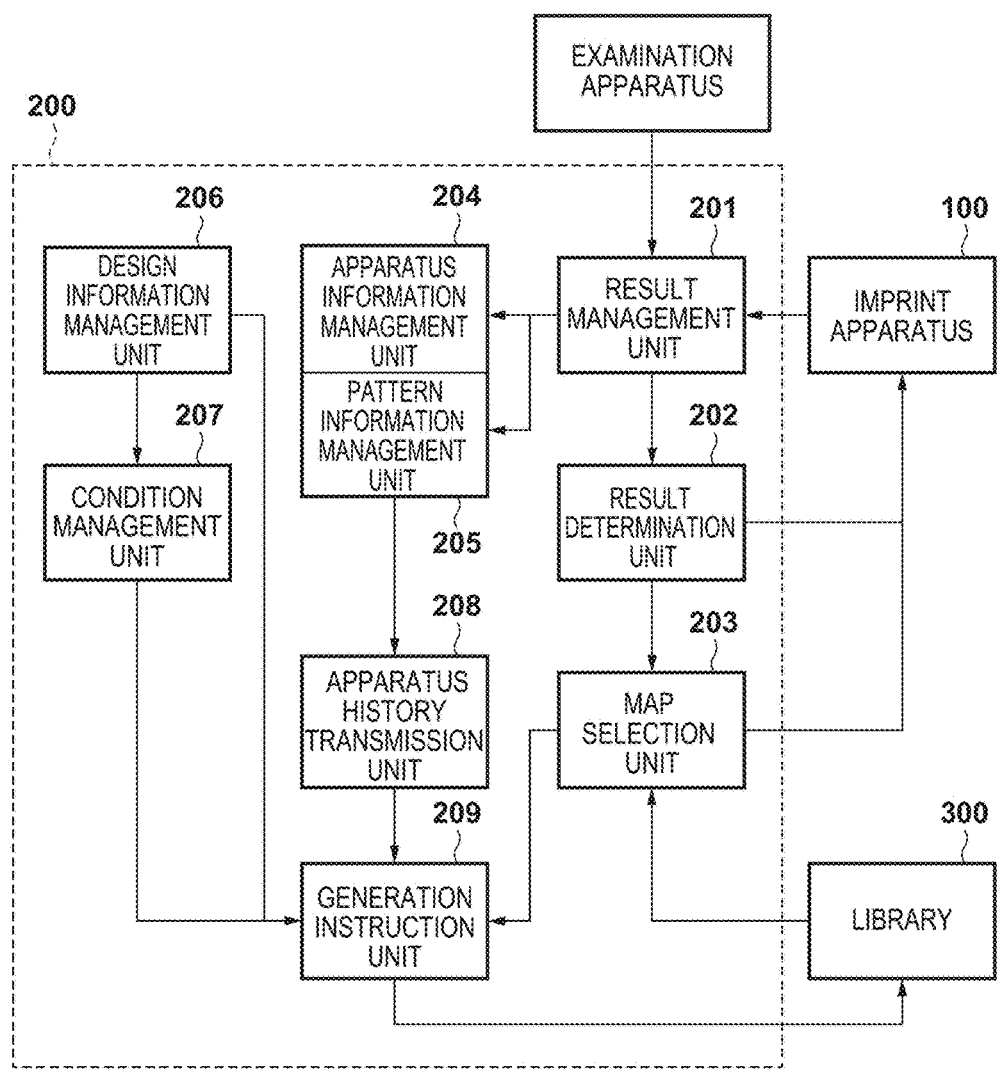
FIG. 3 is a schematic view showing the arrangement of a host server.

FIG. 3 is a schematic view showing the arrangement of the host server 200 in the imprint system 10. The host server 200 can include a result management unit 201, a result determination unit 202, a map selection unit 203, an apparatus information management unit 204, a pattern information management unit 205, a design information management unit 206, a condition management unit 207, an apparatus history transmission unit 208, and a generation instruction unit 209.

The result management unit 201 obtains imprint result information including apparatus conditions at the time of an imprint process, the use history of the mold 101, the use history of the dispenser 110, and an imprint process result from each imprint apparatus 100, and manages these pieces of information. In addition, the result management unit 201 obtains, from an examination apparatus, an analysis result obtained by analyzing an imprint process result obtained by the imprint apparatus 100, and manages the analysis result.

The result determination unit 202 determines, based on the imprint result information managed by the result management unit 201, whether it is necessary to change a map indicating the layout of droplets of the imprint material 120 on a substrate, which is to be supplied from the dispenser 110.

If the result determination unit 202 determines that it is necessary to change the map, the map selection unit 203 selects an optimal map from a plurality of maps managed by the library 300, and transmits the selected map to the corresponding imprint apparatus 100. The map selection unit 203 selects a map based on the identification information of the imprint apparatus 100 and the identification information of the mold 101. If changes (for example, changes over time) have occurred in the imprint apparatus 100 and the mold 101, the map selection unit 203 can select a map corresponding to the changes. As described above, the host server 200 manages information concerning imprint material conditions and information concerning the pattern shape of the mold 101. For this reason, the map selection unit 203 can select a map corresponding to changes in the imprint apparatus 100 and the mold 101 in accordance with these pieces of information. If no optimal map is managed by the library 300, the map selection unit 203 transmits, to the generation instruction unit 209, a job to instruct the generation of a new map (for example, an optimal map).

The apparatus information management unit 204 obtains imprint result information from the result management unit 201, extracts apparatus information from the imprint result information, and manages the extracted information. Such apparatus information can include information concerning imprint process conditions. Likewise, the pattern information management unit 205 obtains imprint result information from the result management unit 201, extracts pattern information from the imprint result information, and manages the extracted information. Such pattern information can include information concerning the pattern shape of the mold 101. In addition, the apparatus information management unit 204 and the pattern information management unit 205 monitor changes in managed information and manage the changes as temporal change information.

The design information management unit 206 manages design information (designed values) of the pattern of the mold 101 and examination information (actual measured values) of the pattern of the mold 101. The condition management unit 207 manages the residual layer thickness of a pattern to be formed on a substrate, layout information of shot regions on the substrate 104, the filling time of an imprint material into the pattern of the mold 101, apparatus settings, and the like.

The apparatus history transmission unit 208 obtains temporal change information from the apparatus information management unit 204 and the pattern information management unit 205, and transmits the temporal change information to the generation instruction unit 209. The generation instruction unit 209 obtains information necessary for the generation of a map from the design information management unit 206, the condition management unit 207, and the apparatus history transmission unit 208 in accordance with a job from the map selection unit 203, and transmits the information, together with a job to instruct the generation of a map, to the generation server 400. The generation instruction unit 209 also refers to map information managed by a map information management unit 301 of the library 300 to determine whether the maps managed by the library 300 are insufficient or may become insufficient. Upon determining that the maps are insufficient or may become insufficient, the generation instruction unit 209 transmits a job to instruct the generation of a new map to the generation server 400.

[Arrangement of Library]

Figure 4:
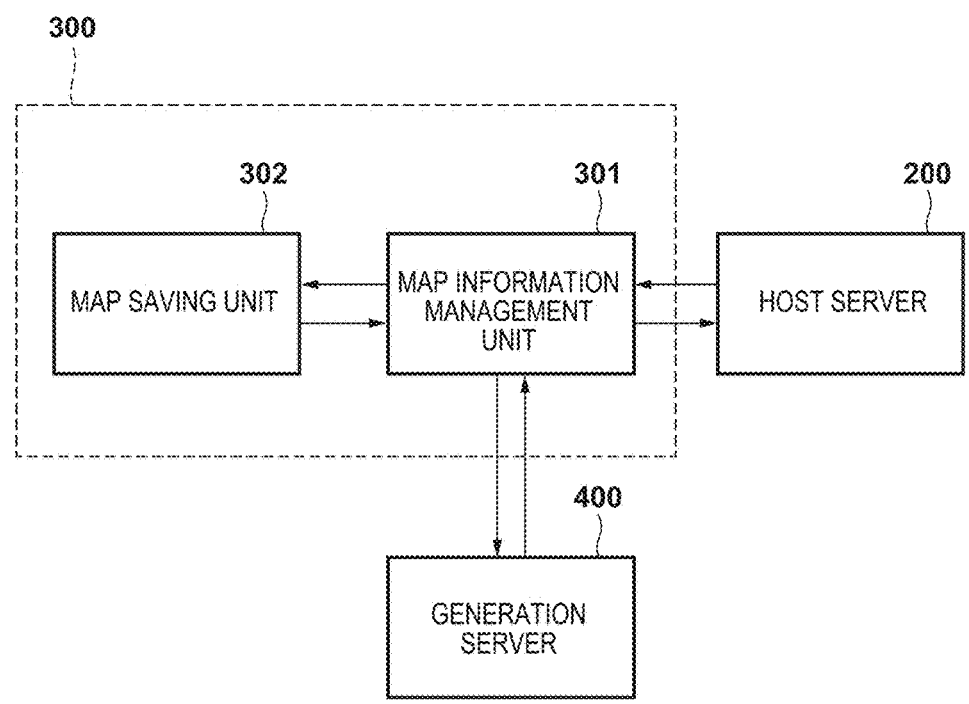
FIG. 4 is a schematic view showing the arrangement of a library.

FIG. 4 is a schematic view showing the arrangement of the library 300 in the imprint system 10. The library 300 can include a map information management unit 301 and a map saving unit 302.

The map information management unit 301 manages map information concerning generation conditions at the time of the generation of maps managed by the library 300. Such map information can include at least one of information concerning imprint material conditions at the time of the generation of a map and information concerning the pattern shape of a mold. In accordance with an inquiry about a map managed by the library 300 from the host server 200, the map information management unit 301 refers to map information to determine whether the corresponding map is managed. If the corresponding map is managed, the map information management unit 301 transmits the map to the host server 200. Upon obtaining a job to instruct the generation of a map from the host server 200, the map information management unit 301 transmits information necessary for the generation of a map to the generation server 400. In addition, the map information management unit 301 obtains map information of the new map generated by the generation server 400 and manages the information.

The map saving unit 302 saves (stores) a map in a file format that allows the transmission of the map to the imprint apparatus 100. The map saving unit 302 transmits a map to the host server 200 via the map information management unit 301 and saves a map generated by the generation server 400.

[Arrangement of Generation Server]

Figure 5:
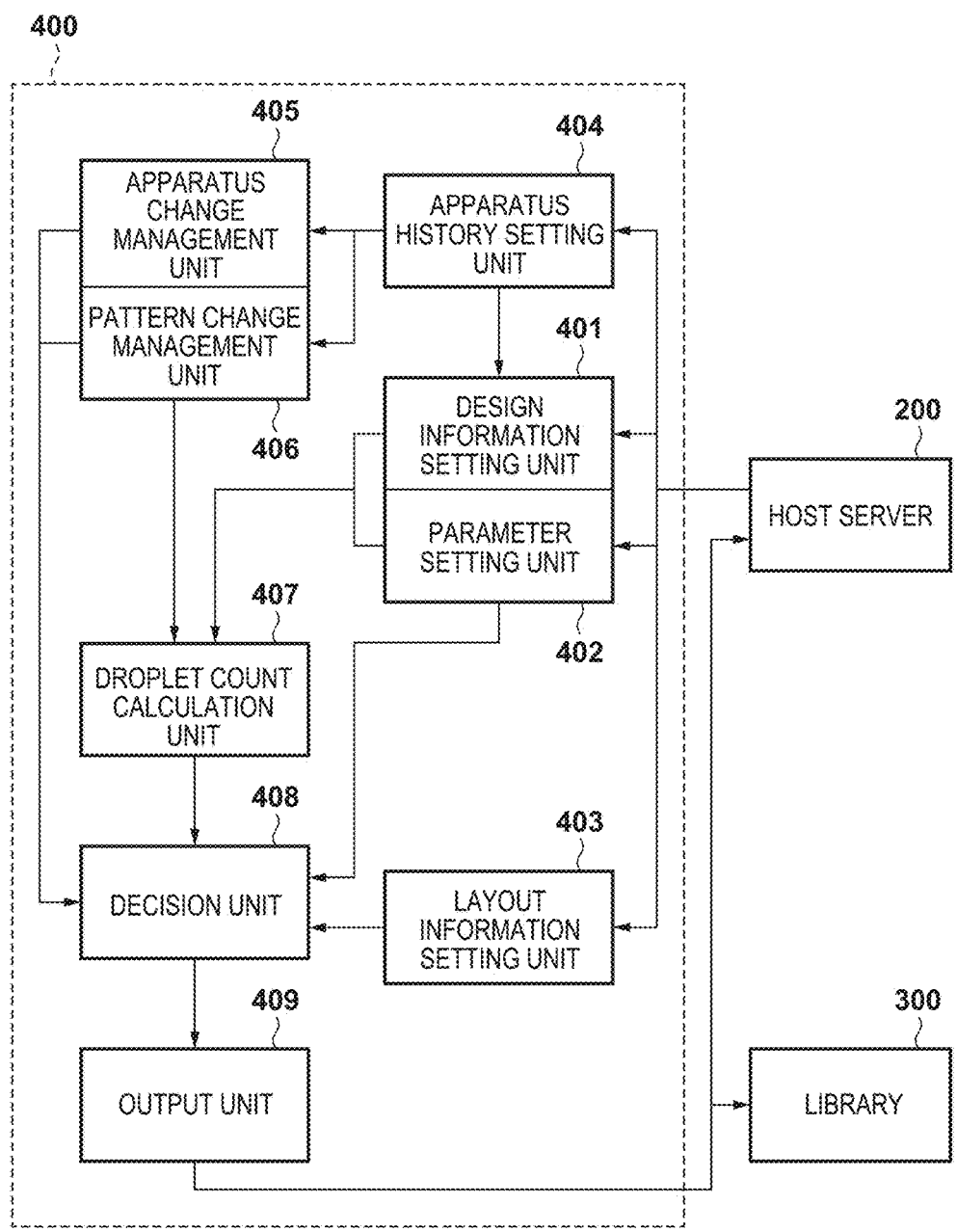
FIG. 5 is a schematic view showing the arrangement of a generation server.

FIG. 5 is a schematic view showing the arrangement of the generation server 400 in the imprint system 10. The generation server 400 includes a design information setting unit 401, a parameter setting unit 402, a layout information setting unit 403, an apparatus history setting unit 404, an apparatus change management unit 405, a pattern change management unit 406, a droplet count calculation unit 407, a decision unit 408, and an output unit 409.

The design information setting unit 401 obtains the design information of a pattern formed on the mold 101 from the host server 200, and sets (inputs) the design information. The parameter setting unit 402 obtains setting information such as the depth of each concave portion (the height of each convex portion) of the mold 101 and the residual layer thickness of a pattern formed on a substrate from the host server 200, and sets (input) the setting information. The parameter setting unit 402 also sets (inputs) constraint conditions such as information concerning the spread of the imprint material 120 on the substrate, the filling time of the imprint material 120 into the pattern of the mold 101, and the intervals between droplets of the imprint material 120 which are required on the substrate.

The layout information setting unit 403 obtains the layout information of shot regions on the substrate 104 from the host server 200, and sets (inputs) the layout information. The apparatus history setting unit 404 obtains, from the host server 200, a droplet correction amount of the imprint material 120 which is calculated from the use histories and the like of the mold 101 and the dispenser 110 and distribution information for the decision of a layout (supply positions) of droplets on a substrate.

The apparatus change management unit 405 manages (provides) a droplet correction amount of the imprint material 120 which is calculated from the use history of the dispenser 110 and distribution information for deciding the layout of droplets on the substrate. The pattern change management unit 406 manages (provides) a droplet correction amount of the imprint material 120 which is calculated from the use history of the mold 101 and distribution information for deciding the layout of droplets on the substrate.

The droplet count calculation unit 407 calculates the supply amount of imprint material 120 to be supplied to an imprint region on a substrate on which an imprint process is performed, that is, the number of droplets of the imprint material 120. The droplet count calculation unit 407 calculates the number of droplets based on information set by the design information setting unit 401 and the parameter setting unit 402, information managed by the apparatus change management unit 405 and the pattern change management unit 406, a droplet correction amount, and the like.

The decision unit 408 decides the layout (supply positions) of droplets of the imprint material 120 on a substrate. The decision unit 408 decides the layout of droplets based on, for example, information set by the design information setting unit 401 and the parameter setting unit 402, information managed by the apparatus change management unit 405 and the pattern change management unit 406, and the number of droplets calculated by the droplet count calculation unit 407. In addition, the output unit 409 outputs a map in a designated format based on the layout of droplets of the imprint material 120 on the substrate which is decided by the decision unit 408. The map output from the output unit 409 is transmitted to the library 300 and managed by it.

[Imprint Process]

Figure 6:
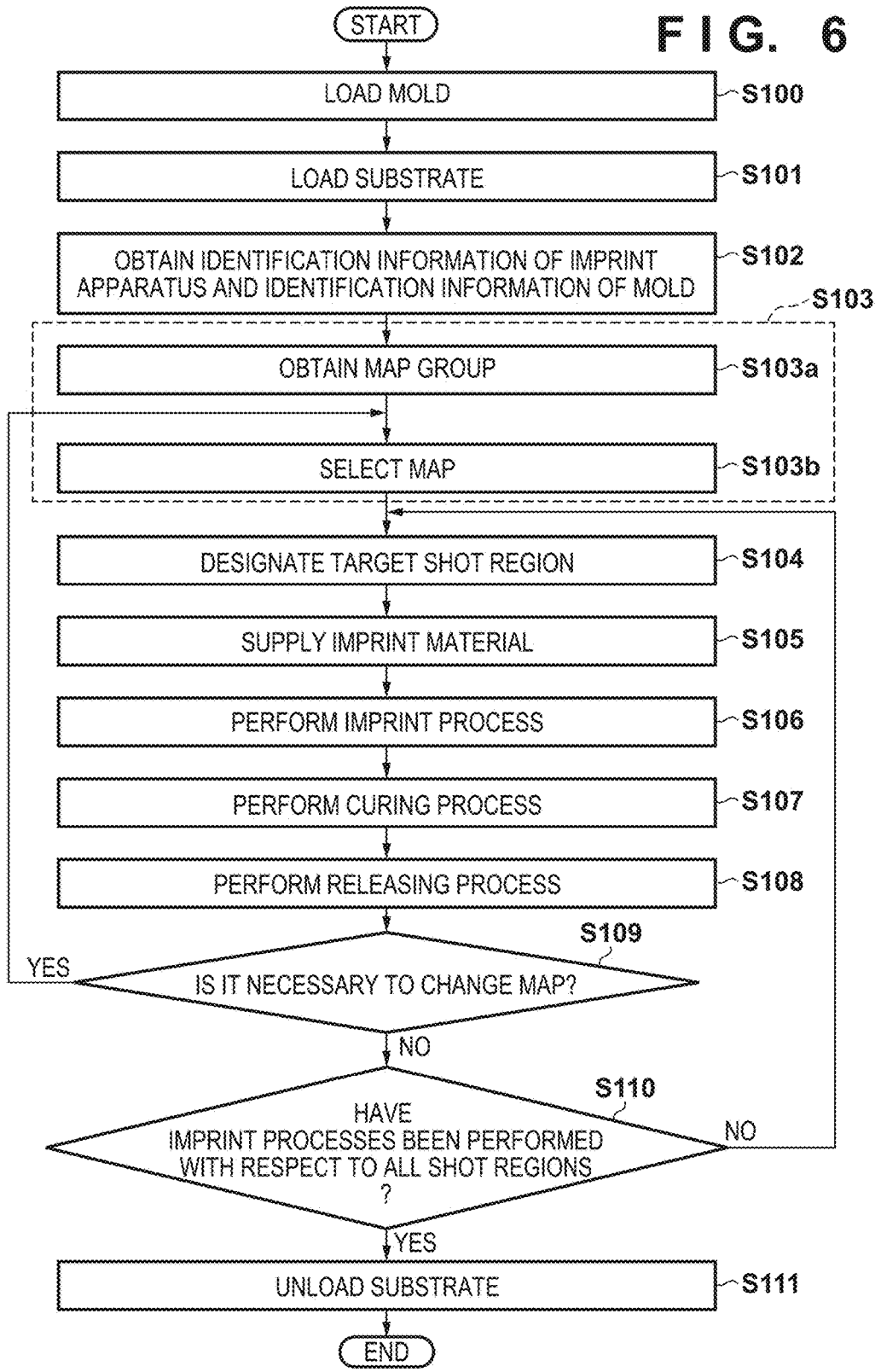
FIG. 6 is a flowchart for explaining an imprint process.

An imprint process in the imprint system 10 will be described in detail. FIG. 6 is a flowchart for explaining an imprint process in the imprint system 10. As described above, an imprint process is performed by causing the host server 200 to comprehensively control each imprint apparatus 100, the library 300, and the generation server 400 and causing the control unit 112 to comprehensively control each unit of the imprint apparatus 100. As described above, the identification information (apparatus ID) of the imprint apparatus 100 is set in the imprint apparatus 100.

Figure 7:
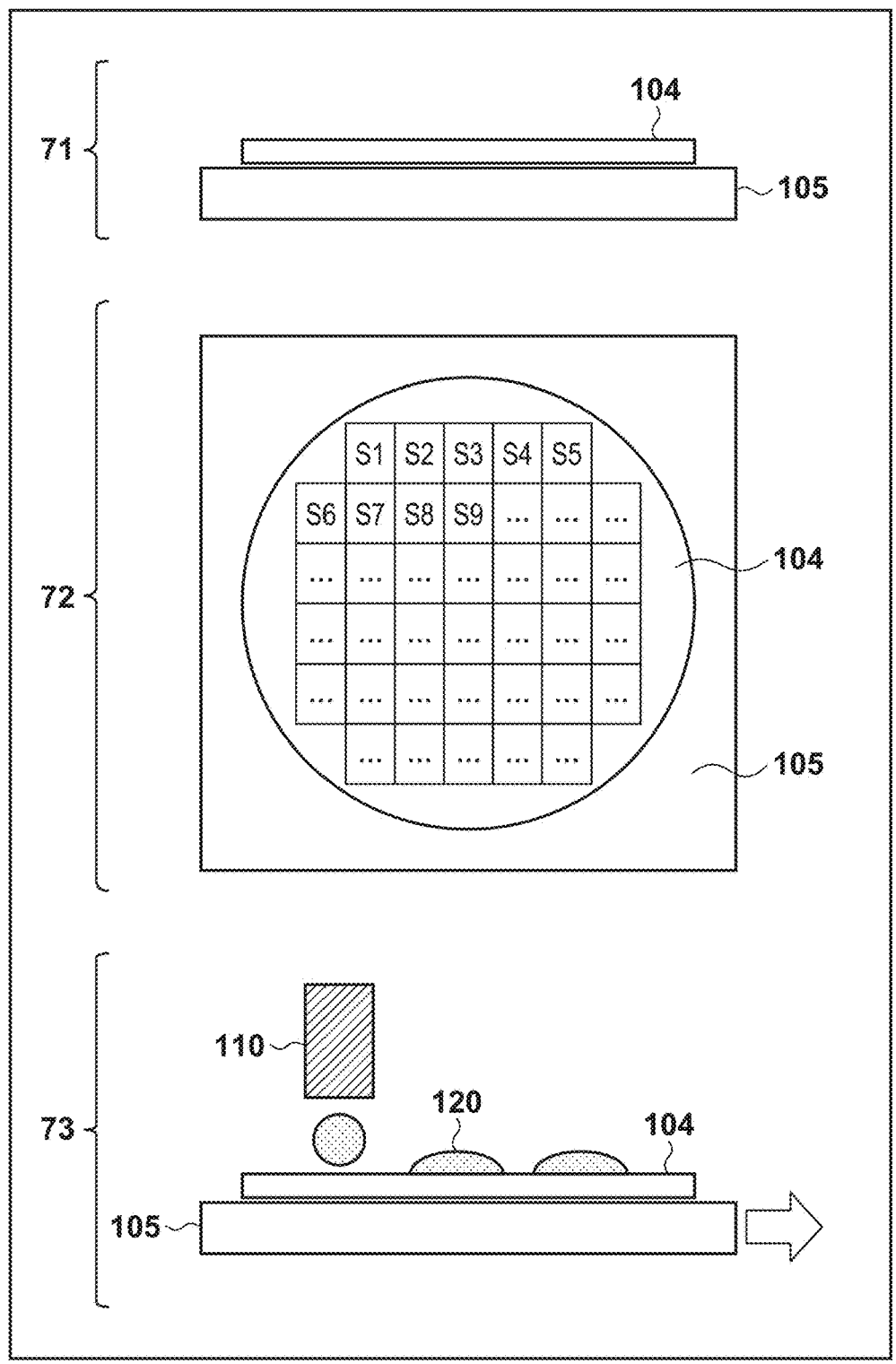
FIG. 7 is a view for explaining an imprint process.

In step S100, the mold 101 which can form a pattern to be formed on the substrate 104 is loaded into the imprint apparatus 100 and is held by the head 102. The mold 101 is obtained by, for example, forming a concave-convex pattern corresponding to design information on a transparent quartz substrate used as a photomask. As described above, the identification information (mold ID) of the mold 101 is set for the mold 101. In step S101, the substrate 104 is loaded into the imprint apparatus 100, and is held by the stage 105 as indicated by "71" in FIG. 7. In step S102, the identification information of the imprint apparatus 100 which performs an imprint process and the identification information of the mold 101 held by the head 102 are obtained.

Step S103 is a step of selecting a map to be used for an imprint process from a plurality of maps managed by the library 300. In step S103a, a map group managed in association with the identification information of the imprint apparatus 100 and the identification information of the mold 101 is obtained from a plurality of maps managed by the library 300. In this case, the host server 200 obtains information concerning imprint material conditions and information concerning the pattern shape of the mold 101 based on the identification information of the imprint apparatus 100 and the identification information of the mold 101. The information concerning the imprint material conditions can include information such as the number of nozzles of the imprint apparatus 100 to be used, the average or variation in the amount of droplets of an imprint material discharged from each nozzle, and position accuracy (landing position variation) of droplets supplied onto the substrate. In addition, the information concerning the imprint material conditions can include a temperature, gas flow, oxygen concentration, and evaporation volume distribution in an imprint environment, a resin type, and an imprint history. The information concerning the pattern shape of the mold 101 can include information concerning actual measured values such as the line width, density, and number of defects of the pattern of the mold 101 and history information such as an imprint count and a cleaning count.

In step S103b, an optimal map for making the pattern shape of the imprint material formed on the substrate become a target shape is selected from the map group obtained in step S103a based on the information concerning the imprint material conditions and the information concerning the pattern shape of the mold 101. The selected map is then set in the corresponding imprint apparatus 100 (dispenser 110). As described above, the map indicates the layout of droplets of the imprint material 120 on the substrate. In other words, the map indicates the amount of imprint material 120 supplied to the substrate 104. That is, the map selected in step S103b may be a map that can reduce defects and layer thickness abnormality occurring in the pattern on the imprint material 120 formed on the substrate 104. In addition, if the map group obtained in step S103a includes no optimal map, an optimal map can be generated by a processing procedure to be described later.

In step S104, of the shot regions on the substrate 104, a shot region which has not undergone an imprint process is designated as a target shot region. In this case, assume that a shot region means a region on which a pattern is formed by one imprint process. In addition, assume that a target shot region means a shot region for which an imprint process is to be performed. In this embodiment, for example, as indicated by "72" in FIG. 7, imprint processes are sequentially performed for consecutive shot regions S1, S2, S3, S4, . . . on the substrate 104. Note however that an imprint process sequence is not limited to one-direction sequence as indicated by "72" in FIG. 7, and may be a reciprocating sequence (zigzag sequence), checkered pattern sequence, or random.

In step S105, the dispenser 110 supplies the imprint material 120 onto the substrate. In this case, as indicated by "73" in FIG. 7, the dispenser 110 sequentially discharges droplets of the imprint material 120 onto the substrate in accordance with the movement of the stage 105 between the map selected in step S104.

Figure 8:
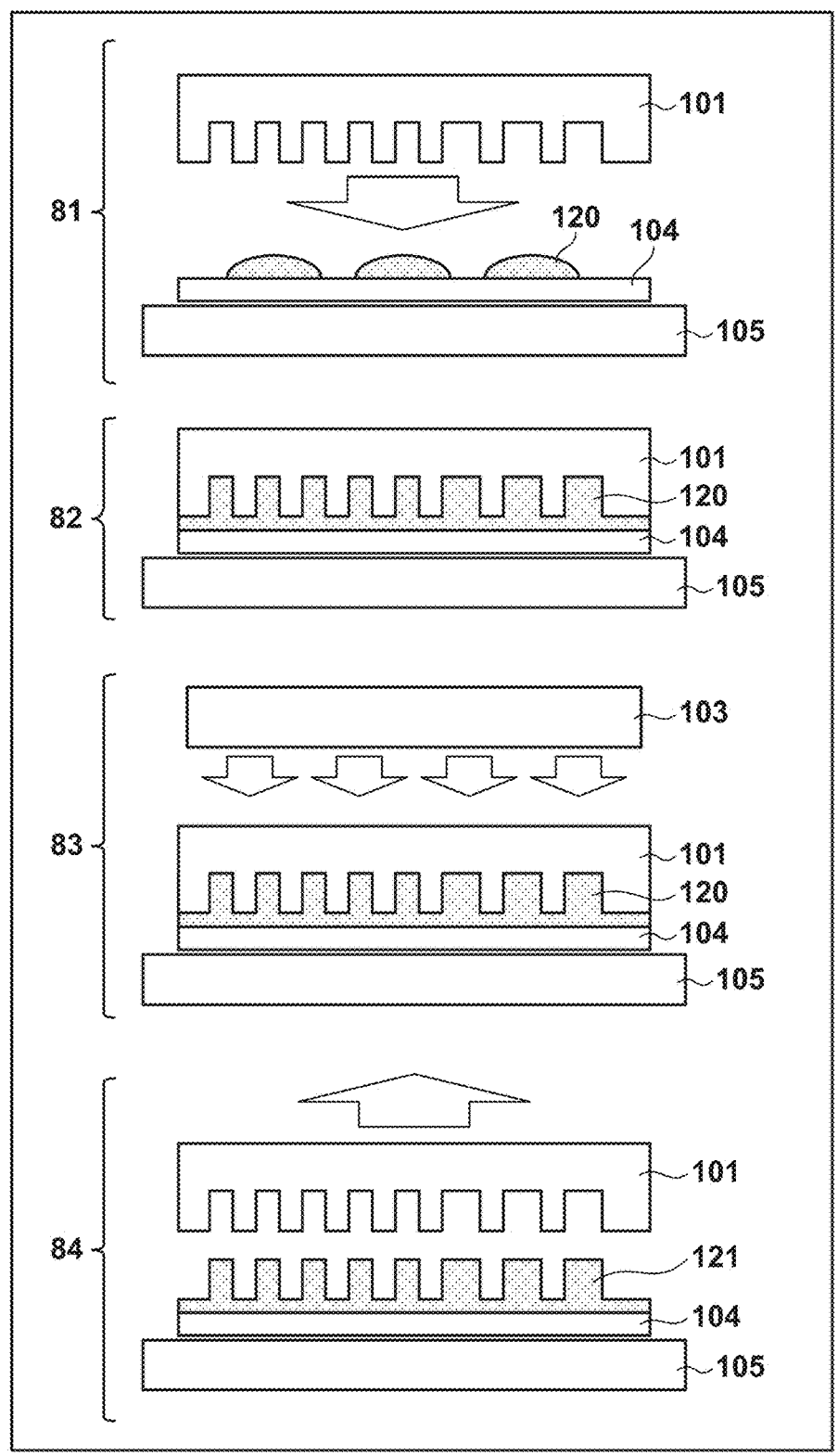
FIG. 8 is a view for explaining an imprint process.

In step S106, an imprint process is performed. More specifically, first of all, as indicated by "81" in FIG. 8, the mold 101 is brought close to the substrate 104 onto which the imprint material 120 is supplied. Subsequently, as indicated by "82" in FIG. 8, while the mold 101 is aligned with the substrate 104, the mold 101 is brought into contact with the imprint material 120 on the substrate. This state is maintained until the pattern of the mold 101 is filled with the imprint material 120. At an early stage in which the mold 101 is in contact with the imprint material 120 on the substrate, since the pattern of the mold 101 is not sufficiently filled with the imprint material 120, non-filling defects have occurred in the corners of the pattern. That is, as the time elapses, the pattern of the mold 101 is filled with the imprint material 120 up to the corners, thereby reducing non-filling defects.

In step S107, a curing process is performed. More specifically, after the pattern of the mold 101 is sufficiently filled with the imprint material 120, the imprint material 120 on the substrate is cured by causing the irradiation unit 103 to irradiate the imprint material 120 with ultraviolet light for a predetermined period of time from the reverse surface of the mold 101, as indicated by "83" in FIG. 8. In step S108, a mold separating process is performed. More specifically, as indicated by "84" in FIG. 8, the mold 101 is released from the cured imprint material 120 on the substrate. This makes it possible to form the pattern formed from the imprint material 120 on the substrate by molding the imprint material 120 on the substrate using the mold 101.

In step S109, it is determined whether it is necessary to change the map selected in step S103b. A criterion for this determination is, for example, changes in imprint process result, that is, changes in the line width (CD), residual layer thickness, number of defects, and the like of the pattern on the imprint material 120 formed on the substrate. In this case, the determination criterion may include a change in the evaporation volume of the imprint material 120 per unit time and a target shot region being a chipped shot region arranged on a peripheral portion of the substrate 104. Such changes can be caused by changes in the number of droplets and landing positions of droplets of the imprint material 120 discharged from the dispenser 110, changes in the dimensions of the pattern of the mold 101, the number of times of use of the mold 101, and the like. In addition, such changes can be caused by variations in the imprinting force and separating force of the mold 101, the catching of dust between the mold 101 and the substrate 104 in an imprint process, and the like. Each imprint apparatus 100 and an external detection apparatus can detect changes in imprint process result. The detection of changes in imprint process result indicates the possibility of causing transfer deficiency (product deficiency) of a pattern. In this case, therefore, the imprint process may be stopped.

If it is necessary to change the map, the process returns to step S103b to select a new map. In this step, an optimal map is selected from the map group obtained in step S103a in consideration of the above changes. If the map group includes no optimal map, items having undergone changes and change amounts are transmitted to the host server 200 to select an optimal map from a plurality of maps managed by the library 300 in consideration of the above changes. If the plurality of maps managed by the library 300 include no optimal map, the items having undergone changes and the change amounts are transmitted to the generation server 400 to make it generate a new map. If it is not necessary to change the map, the process shifts to step S110.

In step S110, it is determined whether imprint processes have been performed with respect to all the shot regions on the substrate 104. If imprint processes have not been performed with respect to all the shot regions on the substrate 104, the process returns to step S104 to designate a shot region having undergone no imprint process as a target shot region. Repeating the processing from step S104 to step S110 can form patterns formed from the imprint material on all the shot regions on the substrate 104. On the other hand, if imprint processes have been performed with respect to all the shot regions on the substrate 104, the process shifts to step S111. In addition, the substrate 104, with all the shot regions having undergone imprint processes, is unloaded from the imprint apparatus 100 in step S111. The lower layer side of the substrate 104 unloaded from the imprint apparatus 100 is processed (for example, etched) using a pattern formed from the imprint material 120. When manufacturing a semiconductor device, these processes are repeated for each process layer.

In this case, when determining (step S109) whether it is necessary to change the map, it may also be determined whether it is necessary to clean the mold 101. If it is not necessary to clean the mold 101, an optimal map is selected from the map group obtained in step S103a in consideration of the above changes. If the map group includes no optimal map, items having undergone changes and change amounts are transmitted to the host server 200 to select an optimal map from a plurality of maps managed by the library 300 in consideration of the above changes. If the plurality of maps managed by the library 300 include no optimal map, the items having undergone changes and the change amounts are transmitted to the generation server 400 to make it generate a new map. In this case, the mold 101 and the substrate 104 which have been used are removed from the imprint apparatus 100 until the completion of the generation of a new map, and another mold 101 and another substrate 104 may be loaded into the imprint apparatus 100 to continue an imprint process. This makes it possible to suppress a reduction in the productivity of the imprint apparatus 100. Even when performing an imprint process with respect to another substrate 104 using another mold 101, a map group associated with the identification information of the imprint apparatus 100 and the identification information of the mold 101 can be obtained from the library 300. When a new map is generated, the map can be stored in the library 300 in association with the identification information of the imprint apparatus 100 and the identification information of the mold 101.

On the other hand, if it is necessary to clean the mold 101, the imprint process is stopped, and the mold 101 is removed from the head 102. In this case as well, in order to suppress a reduction in the productivity of the imprint apparatus 100, another mold 101 and another substrate 104 may be loaded into the imprint apparatus 100 to continue an imprint process.

The mold 101 removed from the head 102 is loaded into a mold cleaning apparatus to be cleaned. The mold cleaning apparatus may be, for example, a cleaning apparatus which wet-cleans dust and contamination adhering to the mold 101 using a chemical or pure water or a cleaning apparatus which performs dry cleaning by using an excimer laser or plasma. Upon completion of cleaning of the mold 101, information indicating that the mold 101 has been cleaned is added to the use history of the mold 101.

When the mold 101 is cleaned, its pattern may be abraded, and a change in pattern shape may occur. For this reason, after the mold 101 is cleaned, the shape (concave-convex shape) of the pattern of the cleaned mold 101 may be measured. More specifically, as the pattern shape of the mold 101, the following are measured: the dimensions of the pattern of the mold 101, the volume ratio (duty cycle) between each concave portion and each convex portion, the depth of each concave portion (the height of each convex portion), a concave-convex taper angle, a surface roughness (Ra), and the like. Such physical amounts representing the pattern shape of the mold 101 can be measured by a general dimension measurement apparatus, height measurement apparatus, and roughness measurement apparatus.

When measuring, for example, the line width and duty cycle of the pattern of the mold 101, an electron beam type dimension measurement apparatus (CD-SEM) may be used. If the pattern of the mold 101 is a pattern of repetition of lines (concave portions) and spaces (convex portions), the widths of lines and the widths of spaces are measured at a plurality of portions. If there is a difference between the mold 101 before cleaning and that after cleaning, the line width of the pattern of the mold 101 has changed. A duty cycle can be obtained from the ratio between lines and spaces.

In addition, when measuring the depth of each concave portion, concave-convex taper angle, and surface roughness of the mold 101, an AFM or confocal microscope may be used. These measurements can be obtained by directly measuring the pattern of the mold 101 or may be indirectly obtained by measuring a measurement pattern provided outside the mold 101.

When the mold 101 is cleaned, the surface (pattern region) of the mold 101 is abraded and thinned by a predetermined amount, and an abrasion amount distribution is generated in accordance with the pattern. If, for example, the pattern of the mold 101 is a pattern of repetition of lines (concave portions) and spaces (convex portions), cleaning increases the width of each concave portion and decrease the width of each convex portion, resulting in an increase in the volume ratio of concave portions. If each convex portion is abraded more, the height of each convex portion decreases, and the concave-convex taper angle decreases. If the concave and convex portions on the surface of the mold 101 reduce, the surface roughness reduces.

Physical amounts representing the pattern (concave-convex shape) of the mold 101 can be obtained from measurement results on the pattern on the imprint material 120 which are obtained by a test imprint process after cleaning instead of measurement results obtained by directly measuring the pattern of the mold 101. When measuring the pattern on the imprint material 120 obtained by a test imprint process, a cross-section obtained by cutting the imprint material 120 may be measured.

The dimensions of the pattern of the mold 101, measured in this manner, are transmitted as the actual measured value of the dimensions of the pattern of the mold 101 to the host server 200 and managed as information concerning the pattern shape of the mold 101. This makes it possible to select a map to be used for an imprint process by using information concerning the pattern shape of the mold 101 after the mold 101 is cleaned, when performing an imprint process by using the cleaned mold.

[Generation of Map]

Figure 9:
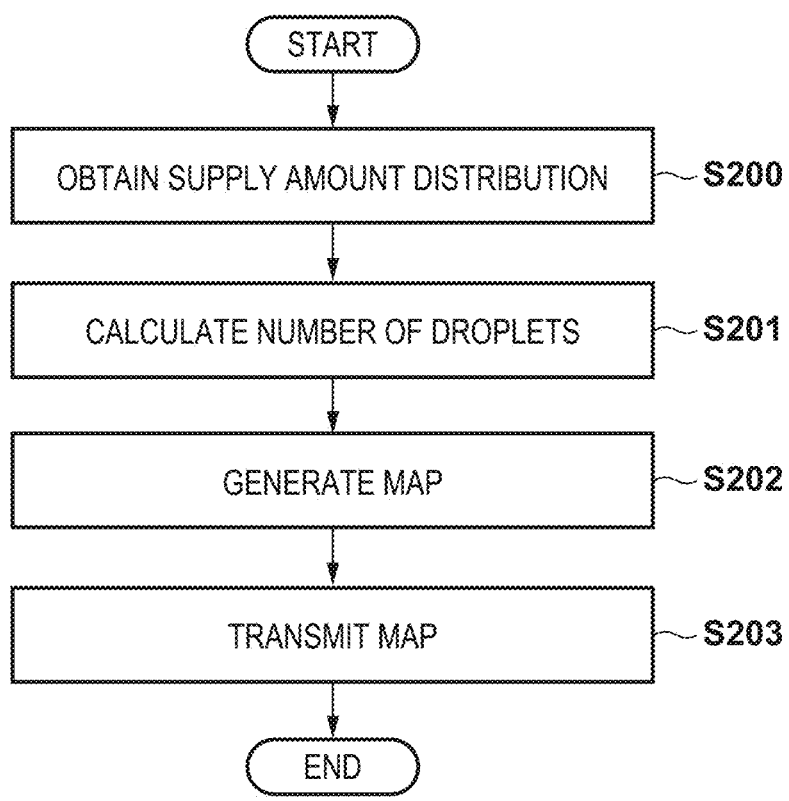
FIG. 9 is a flowchart for explaining a process of generating a map.

The processing of generating a map indicating the layout of droplets of the imprint material 120 on a substrate, which is to be supplied from the dispenser 110, will be described in detail with reference to FIG. 9. In this embodiment, as described above, the generation server 400 generates a map, which is managed by the library 300. Note however that a map may be generated by an information processing apparatus outside the imprint system 10, and the generated map may be managed by the library 300.

In step S200, a supply amount distribution is obtained by calculating the supply amounts (dispensing amounts) of a resin necessary for the respective regions on the substrate from the design information of the pattern of the mold 101 and apparatus information. Based on the identification information of the imprint apparatus 100 and the identification information of the mold 101, a supply amount distribution is calculated from information obtained from the apparatus information management unit 204, the pattern information management unit 205, the design information management unit 206, and the condition management unit 207 of the host server 200. In this case, such information includes the dimensions of the pattern of the mold 101, the residual layer thickness of a pattern to be formed on the substrate, information of distribution in the substrate surface including the evaporation volume distribution of the imprint material 120 and a gas flow distribution in the surface of the substrate 104, and layout information of the shot regions on the substrate 104.

Figure 10:
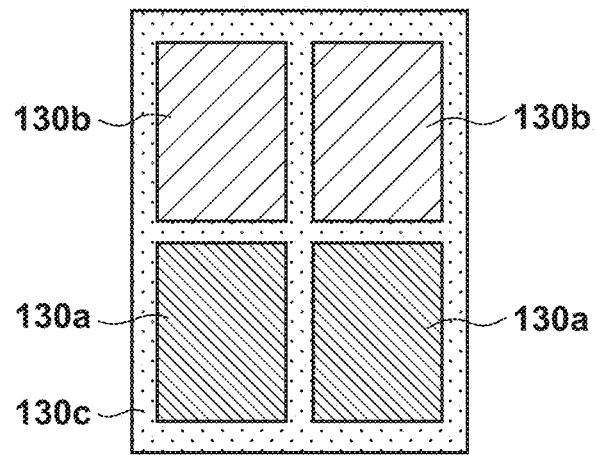
FIG. 10 is a view showing an example of supply amount distribution information.

In this embodiment, as supply amount distribution information, image data obtained by converting the supply amount distribution of the imprint material 120 on the substrate into grayscale multilevel information, as shown in FIG. 10. Referring to FIG. 10, regions 130a to 130c indicate grayscale levels calculated based on the positions, shapes, depths, and the like of patterns of the molds 101. The region 130a indicates a region having a large pattern depth and requiring a large volume of the imprint material 120. The region 130b is a region having a small pattern depth and requiring a smaller volume of the imprint material 120 than the region 130a. The region 130c is a region having no pattern and requiring a smaller volume of the imprint material 120 than the region 130b.

In step S201, the number of droplets of the imprint material 120 required for an imprint region on the substrate based on the supply amount distribution information obtained in step S200 and the size of each droplet (for example, a droplet amount) of the imprint material discharged from the dispenser 110.

Figure 11:
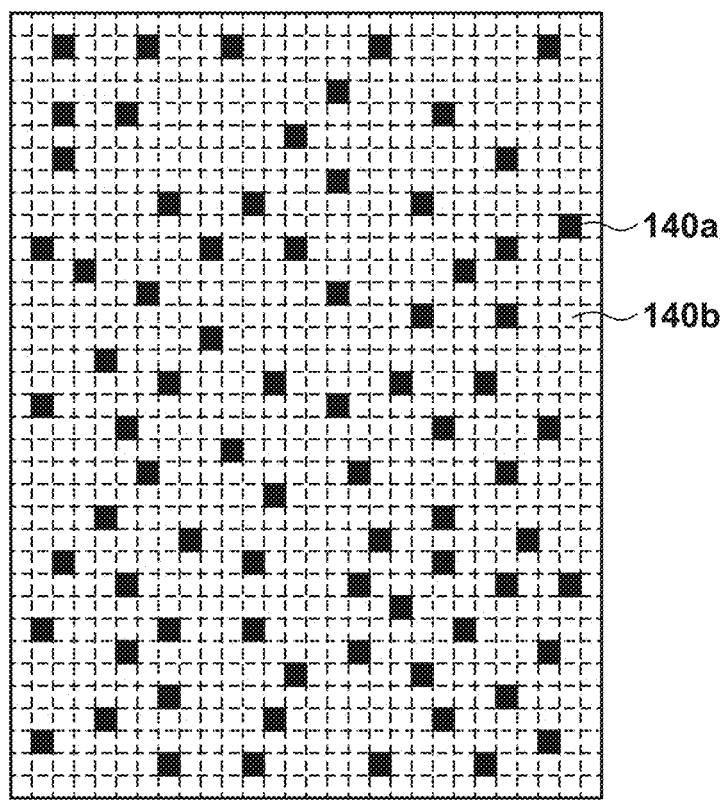
FIG. 11 is a view showing an example of a map.

In step S202, a map indicating the layout of droplets of the imprint material 120 on the substrate, which are to be supplied from the dispenser 110, is generated based on the supply amount distribution obtained in step S200 and the number of droplets calculated in step S201. More specifically, first of all, multilevel distribution data is generated from the supply amount distribution information obtained in step S200. This multilevel distribution data is then binarized by halftone processing to be converted into information designating discharging/non-discharging of the imprint material 120 from the dispenser 110. As halftone processing, an error diffusion method, which is a known technique, can be used. FIG. 11 is a view showing an example of a map generated in step S202. Referring to FIG. 11, black points 140a indicate the supply positions of droplets (discharging of droplets) of the imprint material 120 on the substrate, and white points 140*b* indicate the non-supply positions of droplets (non-discharging of droplets) of the imprint material 120 on the substrate.

In step S203, the map generated in step S202, that is, the map indicating the layout of droplets of the imprint material 120 on the substrate, which is to be supplied from the dispenser 110, is transmitted to the library 300. This map is saved in the map saving unit 302 in the library 300.

This embodiment uses, as a map, data obtained by converting multilevel distribution data into binary information designating discharging/non-discharging of droplets of the imprint material 120. However, the format of data is not specifically limited. For example, it is possible to use, as a map, numeral data representing the supply positions of droplets of the imprint material 120 on the substrate by using relative position coordinates on the substrate. In addition, information concerning the amount (droplet amount) of each droplet of the imprint material 120 on the substrate may be added to the map.

In the imprint system 10 according to this embodiment, the library 300 manages a plurality of maps in association with the pieces of identification information of the imprint apparatuses 100 and the pieces of identification information of the molds 101. Even if, therefore, there are individual differences between a plurality of imprint apparatuses or manufacturing errors in the pattern shapes of a plurality of molds 101, it is possible to select a proper map corresponding to a combination of the imprint apparatus 100 and the mold 101 which are to be used. This makes it possible to equalize imprint process results obtained by a plurality of imprint apparatuses 100.

Second Embodiment

An imprint system according to the second embodiment of the present invention will be described. In the imprint system, a mold 101 used by a predetermined imprint apparatus 100 (a first imprint apparatus 100A (first processing unit)) is sometimes used by another imprint apparatus 100 (a second imprint apparatus 100B (second processing unit)). In this case as well, it is possible to select a map to be used by the second imprint apparatus 100B from a plurality of maps managed by a library 300 based on, for example, the identification information of the imprint apparatus 100 and the identification information of the mold 101. On the other hand, the plurality of maps managed by the library 300 sometimes include no map associated with the identification information of the mold 101 to be used and the identification information of the second imprint apparatus 100B. In this case, a new map may be generated based on information concerning imprint material conditions which are obtained from the identification information of the imprint apparatus 100 and the identification information of the mold 101 and information concerning the pattern shape of the mold 101. However, generating a new map will stop an imprint process in the second imprint apparatus 100B, and hence will decrease the productivity (operating rate) of the imprint apparatus 100. In addition, applying a map used by the first imprint apparatus 100A to the second imprint apparatus 100B without any change may lead to changes in defects, RLT (Residual Layer Thickness), and the like of the pattern formed from the imprint material 120 because of individual differences between the imprint apparatuses.

For this reason, the imprint system according to this embodiment stores, in the library 300 in advance, a plurality of different maps corresponding to differences in imprint process condition between the imprint apparatuses (the first imprint apparatus 100A and the second imprint apparatus 100B). A host server 200 selects a map to be used by the second imprint apparatus 100B from a plurality of maps managed by the library 300 when the mold 101 used by the first imprint apparatus 100A is used by the second imprint apparatus 100B. In this case, based on differences in imprint process condition between the imprint apparatuses, the host server 200 selects a map having differences corresponding to the differences in condition with respect to the map used by the first imprint apparatus 100A. With this operation, even when the mold 101 used by the first imprint apparatus 100A is to be used by the second imprint apparatus 100B, a proper map can be set in the second imprint apparatus 100B without generating any new map.

In this case, if the plurality of maps managed by the library 300 include no proper map corresponding to differences in imprint process condition between the imprint apparatuses, the map used by the first imprint apparatus 100A may be corrected. At this time, the map is corrected by using information concerning imprint process conditions obtained based on the identification information of the imprint apparatus 100 and the identification information of the mold 101 and information concerning the pattern shape of the mold. The corrected map is then decided as a map to be used by the second imprint apparatus 100B. Correcting a map in this manner can reduce a calculation load as compared with generating a new map to be used by the second imprint apparatus 100B (in accordance with the flowchart of FIG. 9). This makes it possible to shorten the time during which the second imprint apparatus 100B is stopped and improve the productivity of the imprint apparatus 100.

An imprint process in the imprint system according to the second embodiment will be described in detail. FIG. 12 is a flowchart for explaining the selection of a map in the imprint system according to the second embodiment, and corresponds to step S103 in the flowchart of FIG. 6. The following description is about the processing of selecting a map to be used by the second imprint apparatus 100B when the second imprint apparatus 100B uses the mold 101 used by the first imprint apparatus 100A. This processing is performed by causing the host server 200 to comprehensively control each imprint apparatus 100, the library 300, and a generation server 400 and causing a control unit 112 to comprehensively control each unit of the imprint apparatus 100.

In step S300, it is determined whether a plurality of maps managed by the library 300 include a target map managed in association with the identification information of the second imprint apparatus 100B and the identification information of the mold 101. In this case, the host server 200 obtains information concerning imprint process conditions and information concerning the pattern shape of the mold 101 based on the identification information of the second imprint apparatus 100B and the identification information of the mold 101. If there is a map managed in association with the identification information of the second imprint apparatus 100B and the identification information of the mold 101, the process shifts to step S301.

In step S301, a map group managed in association with the identification information of the second imprint apparatus 100B and the identification information of the mold 101 is obtained from the plurality of maps managed by the library 300. In step S302, an optimal map for making the pattern shape of the imprint material 120 formed on the substrate by the second imprint apparatus 100B become a target shape is selected from the map group obtained in step S301. This map is selected based on information concerning imprint process conditions and information concerning the pattern shape of the mold.

If it is determined in step S300 that there is no map managed in association with the identification information of the second imprint apparatus 100B and the identification information of the mold 101, the process shifts to step S303.

In step S303, it is determined whether there is any significant difference between an imprint process in the first imprint apparatus 100A and an imprint process in the second imprint apparatus 100B. The determination of whether there is any significant difference is performed based on, for example, a difference in imprint process condition between imprint apparatuses (a difference in imprint process condition between the first imprint apparatus 100A and the second imprint apparatus 100B). If the difference in imprint process condition between the imprint apparatuses is equal to or more than a threshold, it is determined that there is a significant difference. If the difference is smaller than the threshold, it is determined that there is no significant difference. Information concerning imprint process conditions can include, for example, information such as the average or variation in the amount of droplets of an imprint material discharged from the dispenser 110, and the position accuracy (landing position variation) of droplets supplied onto the substrate, and imprint environment information. The imprint environment information can include, for example, information such as the temperature, gas flow, oxygen concentration, and evaporation volume distribution in an imprint environment, a resin type, and an imprint history.

The determination of whether there is any significant difference may also be performed based on information concerning a change in the pattern shape of the mold 101 over time. Such information can include, for example, information concerning changes over time in items such as the depth of each concave portion of the pattern of the mold 101, the line width (CD) of the pattern, a taper angle, and the number of defects. A change in such an item over time can include, for example, at least one of a change in the pattern shape of the mold which is caused by an imprint process in the first imprint apparatus 100A and a change in the pattern shape of the mold 101 caused by a cleaning process for the mold 101. Information concerning a change in the pattern shape of the mold 101 over time can be obtained from a measurement result obtained by directly measuring the pattern shape of the mold 101 when the mold 101 is removed from the first imprint apparatus 100A. However, this is not exhaustive. For example, the imprint material 120 may be molded by a mold in a test imprint process, and the above information may be obtained from a result of measuring the shape of the imprint material 120 (a pattern shape formed by the imprint material 120).

If it is determined in step S303 that there is no significant difference between the imprint process in the first imprint apparatus 100A and the imprint process in the second imprint apparatus 100B, the process shifts to step S304. In step S304, a map group managed by the library 300 in association with the mold 101 to be used and the first imprint apparatus 100A is obtained. In step S305, a map to be used by the second imprint apparatus 100B is selected from the obtained map group based on information concerning imprint process conditions and information concerning the pattern shape of the mold 101.

On the other hand, if it is determined in step S303 that there is a significant difference between the imprint process in the first imprint apparatus 100A and the imprint process in the second imprint apparatus 100B, the process shifts to step S306. In step S306, a map to be used by the second imprint apparatus 100B is selected from a plurality of maps managed by the library 300 based on the difference in imprint process condition between the imprint apparatuses. As described above, imprint process conditions can include, for example, at least one of the evaporation volume of droplets per unit time in the imprint process and the amount and position accuracy of droplets of the imprint material 120 discharged from a dispenser 110. For this reason, the library 300 can manage a plurality of maps generated in advance while the evaporation volume of droplets, the amount and positions of droplets, and the like are changed. This allows the host server 200 to select a map which differs from the map used by the first imprint apparatus 100A in the layout of droplets (the number and positions of droplets) on the substrate in accordance with the difference in imprint process condition between the imprint apparatuses. For example, the host server 200 selects, as a map to be used by the second imprint apparatus 100B, a map having a difference corresponding to the condition difference with respect to the map used by the first imprint apparatus 100A. If the plurality of maps managed by the library 300 include no optimal map to be used by the second imprint apparatus 100B, the map used by the first imprint apparatus 100A may be corrected based on the condition difference. Map correction is performed by, for example, increasing or decreasing the number of droplets in the map used by the first imprint apparatus 100A in accordance with the condition difference. The corrected map is then decided as a map to be used by the second imprint apparatus 100B.

Assume that a plurality of maps which are generated in advance while the amount of droplets (for example, the average amount) of droplets discharged from the dispenser 110 is changed, are managed by the library 300. Assume also that the amount (for example, the average amount) of droplets discharged from the dispenser in the second imprint apparatus 100B is smaller than that in the first imprint apparatus 100A by 0.05 pL. If a threshold for the amount of droplets is set to 0.03 pL, it is determined in step S303 that there is a significant difference between the first imprint apparatus 100A and the second imprint apparatus 100B. In this case, the host server 200 selects, as a map to be used by the second imprint apparatus 100B, a map indicating the number of droplets larger than that indicated by the map used by the first imprint apparatus 100A by a value corresponding to 0.05 pL by which the amount of droplets discharged from the dispenser 110 is smaller than that discharged from the dispenser in the first imprint apparatus 100A.

In this case, if the plurality of maps managed by the library 300 include no map indicating the number of droplets larger than that indicated by the map used by the first imprint apparatus 100A by a value corresponding to a decrease in the amount of droplets, the map used by the first imprint apparatus 100A may be corrected. Map correction can be performed by increasing the number of droplets by a value corresponding to a decrease in the amount of droplets with respect to the map used by the first imprint apparatus 100A based on a difference in imprint process condition between the first imprint apparatus 100A and the second imprint apparatus 100B. The corrected map is decided as a map to be used by the second imprint apparatus 100B.

In step S306, a map to be used by the second imprint apparatus 100B may be selected from the plurality of maps managed by the library 300 based on information concerning a change in the pattern shape of the mold 101 over time. Such information can include, for example, information concerning changes over time in items such as the depth of each concave portion of the pattern of the mold 101, the line width (CD) of the pattern, a taper angle, and the number of defects. For this reason, the library 300 can manage a plurality of maps generated in advance while these items are changed. This allows the host server 200 to select a map which differs from the map used by the first imprint apparatus 100A in the layout of droplets (the number and positions of droplets) on the substrate in accordance with a change in the pattern shape of the mold 101 over time.

Assume that the library 300 manages a plurality of maps generated in advance while the volume of each concave portion of the pattern of the mold 101 is changed. Assume also that the line width (CD) of the pattern has changed by the abrasion of the mold 101, and the volume of each concave portion of the pattern of the mold 101 has increased by 0.7%. In this case, if a threshold for the volume of each concave portion is set to 0.5%, it is determined in step S303 that there is a significant difference between the first imprint apparatus 100A and the second imprint apparatus 100B. In this case, the host server 200 selects, as a map to be used by the second imprint apparatus 100B, a map indicating the number of droplets larger than that indicated by the map used by the first imprint apparatus 100A by a value corresponding to an increase in the volume of each concave portion.

In this case, if the plurality of maps managed by the library 300 include no map indicating the number of droplets larger than that indicated by the map used by the first imprint apparatus 100A by a value corresponding to an increase in the volume of each concave portion, the map used by the first imprint apparatus 100A may be corrected. Map correction can be performed by increasing the number of droplets by a value corresponding to an increase in the volume of each concave portion with respect to the map used by the first imprint apparatus 100A based on information concerning a change in the pattern shape of the mold 101 over time. The corrected map is decided as a map to be used by the second imprint apparatus 100B.

In addition, assume that the residual layer thickness of the imprint material 120 which was equal to a target layer thickness at the start of an imprint process by the first imprint apparatus 100A has decreased by 0.5 nm from the target layer thickness because of a change in the pattern shape of the mold 101 over time. In this case, it is possible to measure the residual layer thickness of the imprint material 120 by using a substrate for which an imprint process or a test imprint process has been performed by the first imprint apparatus 100A. If a threshold for the residual layer thickness of the imprint material 120 is set to 0.4 nm, it is determined in step S303 that there is a significant difference. In this case, the host server 200 selects, as a map to be used by the second imprint apparatus 100B, a map indicating the number of droplets larger than that indicated by the map used by the first imprint apparatus 100A by a value corresponding to a decrease in the residual layer thickness of the imprint material 120. Likewise, when the residual layer thickness of the imprint material 120 has locally decreased, the host server 200 selects a map indicating the number of droplets larger than that indicated by the map used by the first imprint apparatus 100A by a value corresponding to the decrease at the portion whose residual layer thickness has decreased.

In this case, if the plurality of maps managed by the library 300 include no map indicating the number of droplets larger than that indicated by the map used by the first imprint apparatus 100A by a value corresponding to a decrease in residual layer thickness, the map used by the first imprint apparatus 100A may be corrected. Map correction can be performed by increasing the number of droplets by a value corresponding to the decrease in residual layer thickness based on information concerning a change in the pattern shape of the mold 101 over time. The corrected map is decided as a map to be used by the second imprint apparatus 100B.

In the imprint system according to this embodiment, the library 300 manages a plurality of maps generated in advance while the evaporation volume of droplets, the amount and positions of droplets, and the like as imprint process conditions are changed. A map to be used by the second imprint apparatus 100B is selected from the plurality of maps managed by the library 300 based on a difference in imprint process condition between the imprint apparatuses. If an optimal map to be used by the second imprint apparatus 100B is not managed by the library 300, the map used by the first imprint apparatus 100A is corrected in accordance with the difference in imprint process condition between the imprint apparatuses. This makes it possible to shorten the time during which the second imprint apparatus 100B is stopped and improve the productivity of the imprint apparatus 100 even when the second imprint apparatus 100B uses the mold 101 used by the first imprint apparatus 100A.

In this case, if it is determined in step S300 that there is no map managed in association with the identification information of the second imprint apparatus 100B and the identification information of the mold 101, a map group managed in association with only the identification information of the mold 101 may be obtained. In this case, a map used last is selected from the obtained map group, and information concerning imprint process conditions when the imprint apparatus 100 associated with the selected map generated the map is obtained. In addition, a difference between the obtained information and information concerning imprint process conditions in the second imprint apparatus 100B may be obtained. This difference corresponds to the difference in imprint process condition between the imprint apparatuses, and can be used in the subsequent process.

<Embodiment of Method of Manufacturing Article>

A method of manufacturing an article according to an embodiment of the present invention is suitable for manufacturing an article such as a microdevice such as a semiconductor device or an element having a microstructure. This method of manufacturing an article according to this embodiment includes a step of forming a pattern on an imprint material supplied on a substrate by using the above imprint apparatus (a step of performing an imprint process on the substrate) and a step of processing the substrate on which the pattern has been formed in the preceding step. In addition, the manufacturing method further includes other known steps (oxidation, film formation, deposition, doping, planarization, etching, resist removal, dicing, bonding, packaging, and the like). The method of manufacturing an article according to this embodiment is superior to the conventional method in at least one of the performance of an article, quality, productivity, and production cost.

Other Embodiments

Embodiment(s) of the present invention (the control unit) can also be realized by a computer of a system or apparatus that reads out and executes computer executable instructions (e.g., one or more programs) recorded on a storage medium (which may also be referred to more fully as a 'nontransitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-055353 filed on Mar. 18, 2015, which is hereby incorporated by reference herein in its entirety.

What is claimed is:

1. An imprint system which performs an imprint process of forming a pattern of an imprint material on a substrate by using a mold, the system comprising:
 a plurality of processing units including a first processing unit and a second processing unit, each of the first processing unit and the second processing unit having a dispenser configured to supply an imprint material onto a shot region of a substrate and being configured to perform the imprint process;
 a library configured to manage a plurality of pieces of layout information which are different from each other, each of the plurality of pieces of layout information indicating a layout of the imprint material to be supplied from the dispenser onto a shot region; and
 controller configured to control the plurality of processing units,
 wherein in a case where the mold that has been used by the first processing unit is to be used by the second processing unit, the controller is configured to:
 select layout information different from first layout information which has been used by the first processing unit from among the plurality of pieces of layout information managed by the library, as second layout information to be used by the second processing unit, based on a difference in a condition for the imprint process between the first processing unit and the second processing unit, and
 control the second processing unit to supply an imprint material onto a shot region from the dispenser based on the selected second layout information.

2. The system according to claim 1, wherein the condition for the imprint process includes at least one of an evaporation volume of imprint material per unit time in an imprint process and an amount and position accuracy of imprint material supplied from the dispenser to a shot region.

3. The system according to claim 1, wherein the controller is configured to select the second layout information, further based on a change in a pattern shape of the mold over time, such that the change in the pattern shape of the mold over time is compensated by a difference between the first layout information and the second layout information.

4. The system according to claim 3, wherein the controller is configured to obtain information concerning the change in the pattern shape of the mold over time from a result of measuring the pattern shape of the mold or a result of measuring a shape of an imprint material molded by the mold.

5. The system according to claim 3, wherein the change in the pattern shape of the mold over time includes at least one of a change in the pattern shape of the mold caused by the imprint process in the first processing unit and a change in the pattern shape of the mold caused by a cleaning process for the mold.

6. The system according to claim 3, wherein the change in the pattern shape of the mold over time includes at least one of changes in depth, taper angle, and line width of each of concave portions included in a concave-convex pattern formed on the mold.

7. The system according to claim 1, wherein the library manages the plurality of pieces of layout information in association with a processing unit and a mold, and
 the controller is configured to select the second layout information from among the plurality of pieces of layout information managed by the library, based on the difference in the condition for the imprint process, in a case where the plurality of pieces of layout information include no layout information managed in association with the mold and the second processing unit.

8. The system according to claim 1, wherein in a case where the plurality of pieces of layout information include no layout information as the second layout information capable of compensating the difference in the condition for the imprint process, the controller is configured to generate the second layout information by correcting the first layout information.

9. The system according to claim 8, wherein the controller is configured to generate the second layout information by increasing or decreasing the number of imprint materials in the first layout information in accordance with the difference in the condition for the imprint process.

10. The system according to claim 1, wherein the plurality of pieces of layout information are generated based on a dimension of a pattern formed on the mold and a residual layer thickness of the imprint material to be formed on a shot region after the imprint material is molded by the mold.

11. The system according to claim 10, wherein the dimension of the pattern formed on the mold includes a desired value or an actual measured value of the pattern formed on the mold.

12. The system according to claim 1, wherein each of the first processing unit and the second processing unit has a holder configured to hold a mold, and a stage configured to hold a substrate.

13. The system according to claim 1, wherein the controller is configured to select, as the second layout information, layout information different from the first layout information by an amount of an imprint material capable of compensating the difference in the condition for the imprint process between the first processing unit and the second processing unit.

14. The system according to claim 13, wherein the amount of the imprint material capable of compensating the difference in the condition for the imprint process is defined by the number of droplets of the imprint material to be supplied on a shot region.

15. The system according to claim 1, wherein the controller is configured to select the second layout information, such that the difference in the imprint process between the first processing unit and the second processing unit is compensated by a difference between the first layout information and the second layout information.

* * * * *